(12) United States Patent
Chaput et al.

(10) Patent No.: US 11,302,859 B2
(45) Date of Patent: Apr. 12, 2022

(54) ZERO-POWER WAKE-UP SENSING CIRCUIT IN PIEZOELECTRIC HAPTIC FEEDBACK

(71) Applicant: Boréas Technologies Inc., Bromont (CA)

(72) Inventors: Simon Chaput, Magog (CA); Martin Renaud, Granby (CA)

(73) Assignee: Boréas Technologies Inc., Bromont (CA)

( * ) Notice: Subject to any disclaimer, the term of this patent is extended or adjusted under 35 U.S.C. 154(b) by 875 days.

(21) Appl. No.: 16/136,347

(22) Filed: Sep. 20, 2018

(65) Prior Publication Data

US 2020/0098967 A1     Mar. 26, 2020

(51) Int. Cl.
*H01L 41/04* (2006.01)
*H01L 41/113* (2006.01)
*G01B 7/16* (2006.01)

(52) U.S. Cl.
CPC ........ *H01L 41/042* (2013.01); *H01L 41/1132* (2013.01); *G01B 7/16* (2013.01)

(58) Field of Classification Search
CPC .................................................... H01L 41/042
USPC ................................................. 310/317, 314
See application file for complete search history.

(56) References Cited

U.S. PATENT DOCUMENTS

| | | | |
|---|---|---|---|
| 4,490,639 A | 12/1984 | Echols et al. | 310/319 |
| 8,810,105 B2 | 8/2014 | Rönning et al. | 310/318 |
| 8,960,022 B2 | 2/2015 | Tanhua et al. | 73/862.541 |
| 9,880,663 B2 | 1/2018 | Keski-Jaskarl | G06F 3/0418 |
| 2004/0246239 A1 | 12/2004 | Knowles et al. | |
| 2006/0012583 A1 | 1/2006 | Knowles et al. | |
| 2011/0080367 A1 | 4/2011 | Marchand et al. | 345/174 |
| 2014/0230575 A1 | 8/2014 | Piciotto et al. | 73/862.625 |
| 2016/0129475 A1* | 5/2016 | Nielsen | B06B 1/0261 |
| | | | 310/317 |
| 2016/0246372 A1* | 8/2016 | Shimizu | G06F 3/016 |

FOREIGN PATENT DOCUMENTS

| | | |
|---|---|---|
| EP | 3018825 A1 | 5/2016 |
| EP | 3065029 A1 | 9/2016 |
| EP | 3113365 A2 | 1/2017 |
| WO | 2013140759 A1 | 9/2013 |
| WO | 2017151650 A1 | 9/2017 |

\* cited by examiner

*Primary Examiner* — Derekj J Rosenau
(74) *Attorney, Agent, or Firm* — Stratford Group Ltd.

(57) ABSTRACT

Piezoelectric elements are attractive for systems in which both sensing and actuating is required because a single element, i.e. the piezoelectric actuator, can be used that act as both a sensor and an actuator. In conventional systems combining both actuating and sensing functionality, active circuitry is required to read the sensor, and that circuitry requires static and/or dynamic current from a few microamps to a few milliamps. In systems where buttons are used a few times a day, this requirement for current leads to a significant amount of wasted power. Accordingly, a wake-up circuit is provided that does not draw power when no force is applied to the piezoelectric actuator but is capable of detecting pressure applied to the piezo actuator, generate a power-up signal to the actuating circuit, and initiate a haptic feedback with low-latency.

20 Claims, 6 Drawing Sheets

ZERO-POWER WAKE-UP SENSING CIRCUIT IN PIEZOELECTRIC HAPTIC FEEDBACK

TECHNICAL FIELD

The present invention relates to a wake-up circuit, and in particular to a wake-up circuit for use in a haptic feedback system including a piezoelectric actuator.

BACKGROUND

The piezoelectric effect is a reversible process, whereby when a force is applied to a piezoelectric material, an electrical charge is generated, and when an electrical charge is applied to a piezoelectric material, a force is generated. The electrical charges can be measured either as a current or a voltage, and provide a good way to estimate the mechanical strain applied on the material. An example application would be to use a piezoelectric material to replace a mechanical switch. Accordingly, when a user presses on a button comprising the piezoelectric material, a voltage/current is generated, whereby this change in voltage/current can be detected by an electronic device, which notifies a system that the user pressed on the button.

The reverse piezoelectric effect has the opposite result. When applying a voltage to a piezoelectric material, a mechanical strain is generated in the piezoelectric material. The strain will create a force and/or displacement of the piezoelectric material depending on the application. An example application is in a haptic actuator, in which it is desired to generate a sensation, e.g. a vibration, for providing a sensory feedback to a user. The device will apply a voltage waveform to the haptic actuator to generate the desired sensation. Generally speaking, for useful movement or force, tens to hundreds of volts need to be applied to a piezo actuator to generate a discernable sensation.

For systems in which both sensing and actuating is required, piezoelectric actuators are attractive because the system can use a single element, i.e. the piezoelectric actuator, that will act both as a sensor and an actuator. The dual function element enables applications, such as mechanical button replacement, in which sensing is required to provide a command to the system, and haptic feedback is required to provide a natural user interface to the system.

Unfortunately, problems arise when trying to combine both actuating and sensing functionality in a simple system. First, the input signal when the user presses on the actuator can be limited to only single digits volts, e.g. 1 V to 10 V, while the voltage required to generate a good haptic sensation can be several tens to hundreds of volts. That poses two challenges: 1) the sensing electronics needs to be able to accept a high voltage signal, e.g. 100 V or more, safely; and 2) be sensitive enough to detect a signal having only 1 V of amplitude. Thus many sensing front-end electronics have a resistive path to scale down the voltage to enable the voltage to be read, e.g. with ADCs or other similar means. However the resistive path lowers the sensitivity of the system by continuously discharging the piezo actuator and reducing the signal amplitude. The second problem is that active circuitry is required to read the sensor, and that circuitry requires static current and/or dynamic current from a few microamps to a few milliamps to operate. In systems where buttons are used a few times a day, this requirement for excess current leads to a significant amount of wasted power.

An object of the present invention is to overcome the shortcomings of the prior art by providing a wake-up circuit that does not draw power when not applying pressure but is capable of detecting pressure applied to the piezo actuator, generate a power-up signal to the actuating circuit, and initiate a haptic feedback with low-latency.

SUMMARY OF THE INVENTION

Accordingly, the present invention relates to a piezoelectric circuit comprising:
a piezoelectric actuator for generating a sensing signal in response to a force application, and for generating a haptic response in response to a haptic voltage signal;
a driver circuit for generating the haptic voltage signal in response to a wake-up signal;
a wakeup circuit that does not draw power when force is not applied to the piezo actuator comprising: a capacitor coupled to the piezoelectric actuator; a transistor including a first terminal capacitively coupled via the capacitor to the piezo electric actuator for receiving the sensing signal, a second terminal connected to a voltage source, and a third terminal connected to ground, wherein the transistor conducts when the sensing signal is valid; an output connected to the second terminal for providing the wake-up signal to the actuator circuit when the transistor conducts; and
a feedback including a switch providing a path to ground in between the capacitor and the first terminal, wherein the switch is closed when the transistor conducts protecting the transistor from the haptic voltage signal or any voltage signal high enough to damage the transistor.

Another aspect of the present invention relates to a piezoelectric circuit comprising:
a piezo electric actuator for generating a sensing signal in response to a force application, and for generating a haptic response in response to a haptic voltage signal;
a driver circuit for generating the haptic voltage signal;
a wakeup circuit comprising: a capacitor coupled to the piezoelectric actuator; a transistor including a first terminal capacitively coupled via the capacitor to the piezo electric actuator for receiving the sensing signal, a second terminal connected to a voltage source, and a third terminal connected to ground, wherein the transistor conducts when the sensing signal is above a first threshold voltage; and an output connected to the second terminal;
a feedback loop including a switch providing a path to ground in between the capacitor and the first terminal; and
a controller connected to the output, and capable of: determining when the sensing signal is valid, providing a wake-up signal to the actuator circuit when the transistor conducts, closing the switch to provide a path to ground between the capacitor and the first terminal thereby disabling the capacitive coupling between the piezo electric actuator and the first terminal, and activating the actuator circuit to transmit the haptic voltage signal to the piezo electric actuator providing a haptic response to the force application.

Another feature of the present invention provides a piezoelectric circuit comprising:
a piezo electric actuator for generating a sensing signal in response to a force application, and for generating a haptic response in response to a haptic voltage signal;
a driver circuit for generating the haptic voltage signal;
a wakeup circuit comprising: a capacitor coupled to the piezoelectric actuator; a transistor including a first terminal capacitively coupled via the capacitor to the piezo electric actuator for receiving the sensing signal, a second terminal connected to a voltage source, and a third terminal connected to ground, wherein the transistor conducts when the sensing signal is above a first threshold voltage; an output connected to the second terminal for providing a wake-up signal to the actuator circuit when the transistor conducts; and a clamping diode connected between the first terminal and a reference voltage capable of preventing a voltage at the first terminal from exceeding a predetermined amount.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

The piezoelectric actuator circuit ideally includes the following characteristics: 1) a single piezo element that acts both as sensor and actuator; 2) zero power consumption when pressure in not applied to the piezo actuator, i.e. no static or dynamic power except leakage current, whereby the wake-up circuit may continuously sense the piezo actuator for applied pressure; 3) low latency, e.g. less than 30 ms, preferably less than 10 ms, more preferably less than 1 ms, actuating circuit from power-up to waveform generation ready; and 4) wake-up circuit with capacitive coupling and high input impedance for: i) improved sensitivity at low frequencies (signal amplitude and frequency) over resistor divider; and ii) safe interface between high voltage signal and low voltage electronics.

Figure 1:
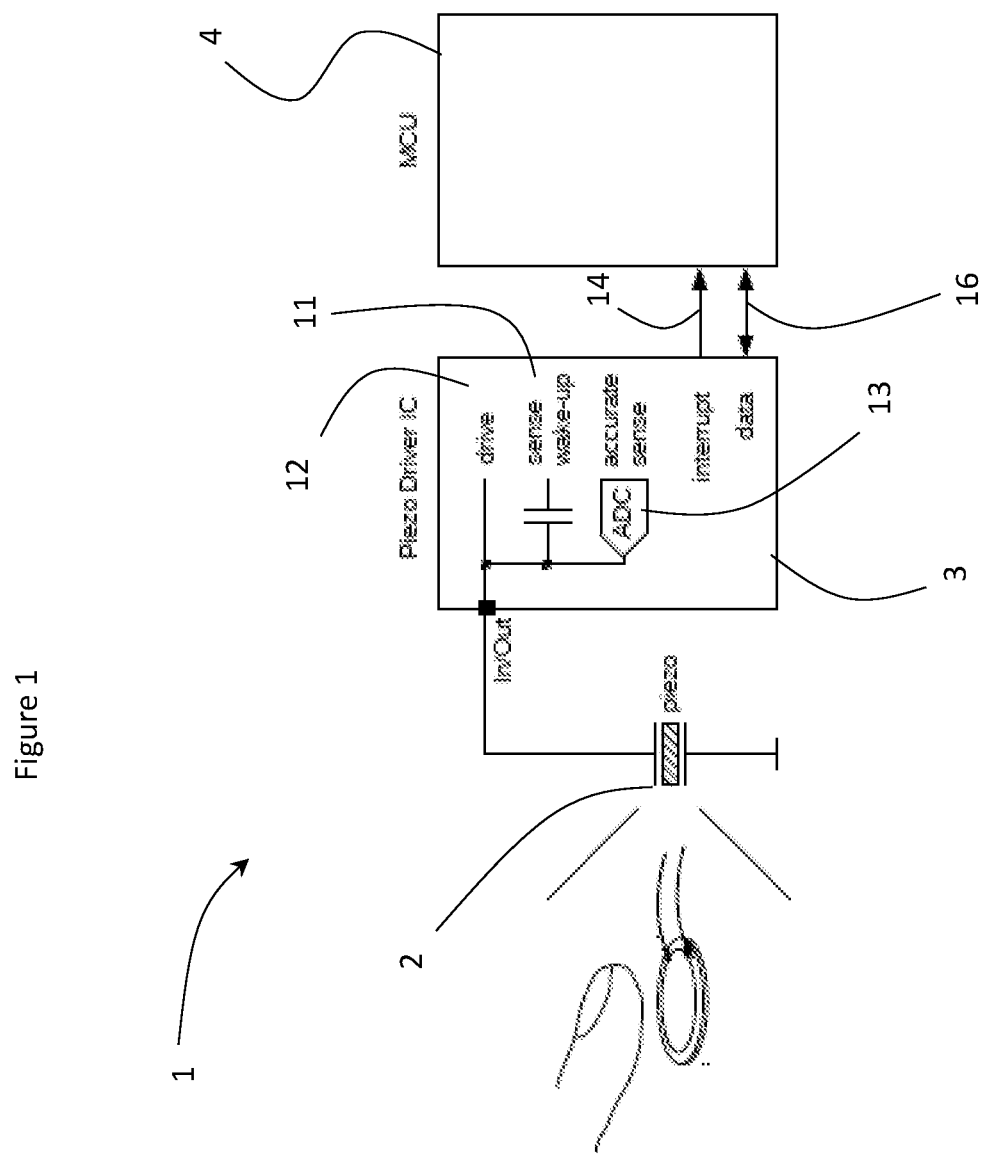
FIG. 1 is a schematic diagram of a haptic feedback circuit in accordance with an embodiment of the present invention.

With reference to FIG. 1, a piezoelectric device 1 of the present invention may include a piezoelectric material actuator 2, a piezo driver integrated circuit (IC) 3, which is able to sense and actuate the piezoelectric (piezo) actuator 2, and a microcontroller unit (MCU) 4. The piezoelectric material in the actuator 2 may be comprised of any suitable material, such as: naturally occurring crystals, e.g. quartz, synthetic crystals, e.g. langasite and lithium niobite, or synthetic ceramics, e.g. barium titanate, lead titanate and lead zirconate titanate (PZT).

The IC 3 includes a wakeup circuit 11 for detecting pressure on the piezo actuator 2 above a predetermined threshold, an analog to digital converter (ADC) 13 to accurately sense after wake-up the piezo signal for validity checking, a driver circuit 12 for transmitting a haptic voltage signal to the piezo actuator 2 for generating a sensation in response to a valid pressure activation.

A MCU 4 may be notified by the wakeup circuit 11 via an interrupt line 14 extending between the piezo IC 3 and the MCU 4 of an event occurring on the piezo actuator 2. A data connection 16 extending between the piezo IC 3 and the MCU 4 may be used in both directions, enabling the MCU 4 to receive signals and send instructions to and from the piezo IC 3. The IC 3 and the MCU 4 may be provided on a single integrated circuit, if desired.

Figure 2:
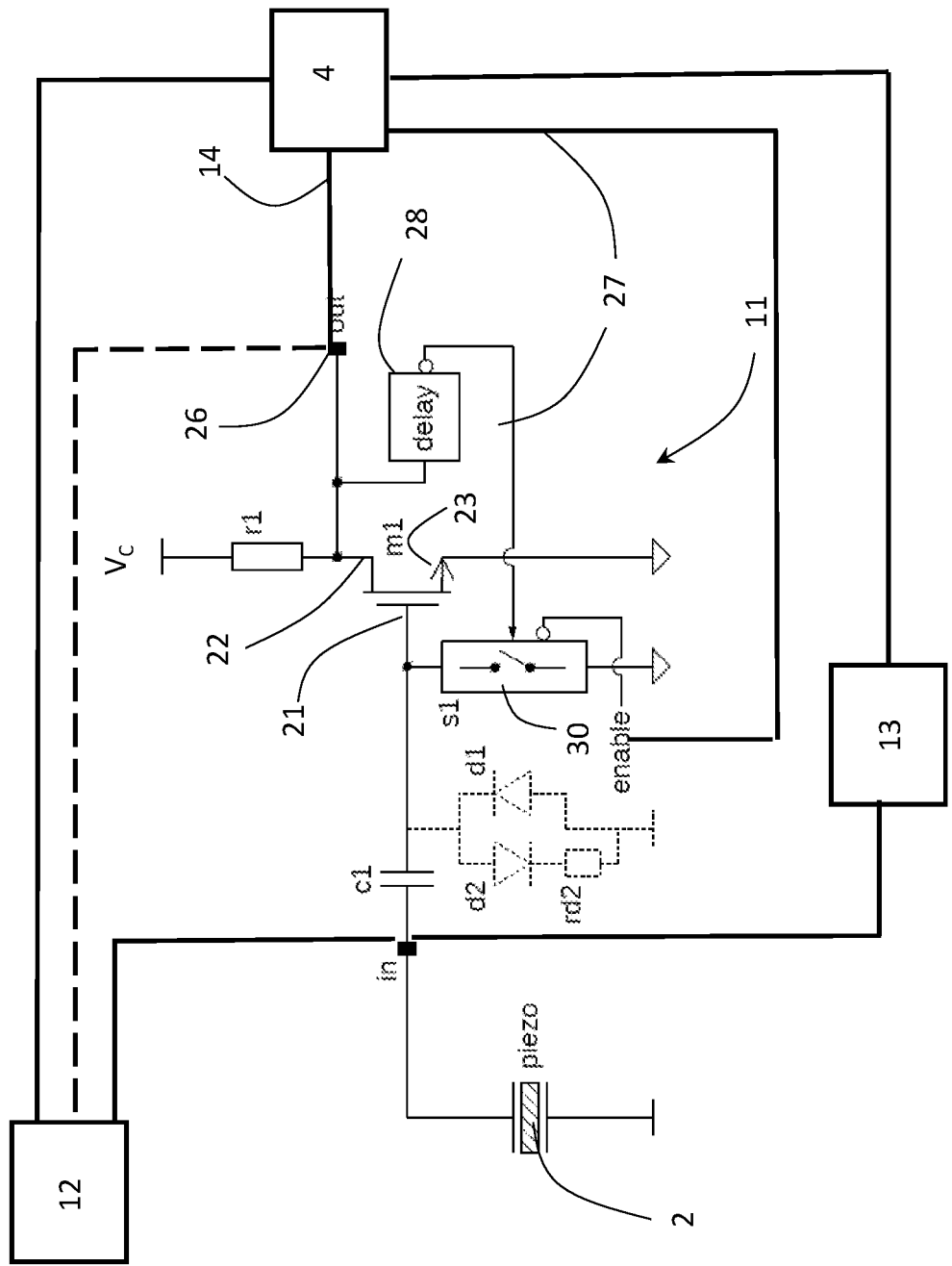
FIG. 2 is a schematic diagram of a wake-up circuit of the device of FIG. 1.

With reference to FIG. 2, the wakeup circuit 11 may comprise a common source circuit including any suitable transistor m1, e.g. an NMOS transistor, including first, second, and third terminals 21, 22, and 23, e.g. gate, drain and source. The piezo actuator 2 may be AC coupled to the first terminal 21 via a high voltage capacitor c1, ideally only the capacitor c1 without any resistors. A high-voltage capacitor, may be a capacitor with a breakdown voltage equal to or greater than the largest signal expected between the two terminals, e.g. the haptic voltage signal. For example, in a 100V piezo IC 3, a high voltage capacitor with at least a voltage rating of 100V would be required. If the piezo IC 3 is made for a 20V signal, the capacitor breakdown should be at least 20V.

The use of a coupling capacitor c1, instead of a resistor in an alternative embodiment, enables the piezo actuator 2 to be biased to any dc voltage, for example the piezo actuator 2 may be biased to the supply voltage of the piezo IC 3, e.g. Vc of 1V to 5V. Also, since the capacitor c1 has a large DC impedance, the charges generated by the piezo actuator 2 will accumulate during an actuation activity, building a strong input signal. For typical sensing signal frequency of about 10 Hz, the capacitor c1 will pass the wake-up voltage signal with a ratio close to 1:1, whereby even a 1V wake-up voltage signal will be enough to trigger the wake-up circuit 11 using the transistor threshold voltage of the transistor m1 as threshold. However, the capacitor c1 may increase the gate voltage of m1 at large haptic signal voltages and destroy the transistor m1. Accordingly, to protect the transistor m1 from the high voltages, a protective circuit, e.g. including a latency feedback system 27, comprising diodes d1 and d2 and/or active switches 30, may be provided to make sure the gate voltage of the transistor m1 stays within acceptable limits, i.e. less than a voltage that would damage the transistor m1 such as the haptic voltage signal or too high a sensing voltage signal. The feedback system 27 may extend between the second terminal 22 and the first terminal 21 or between the MCU 4 and the first terminal 21.

The voltage source Vc, e.g. the power supply for the piezo IC 3 of between 1V to 5V, is connected to the second terminal 22 via a load resistor r1 or other suitable pull-up circuit. An output 26 is also connected to the second terminal 22 for connection with one or both of the driver circuit 12 and the MCU 4 via the interrupt 14.

The first terminal 21, e.g. gate, of the transistor m1 is protected from high voltage by a delay feedback system 27 to hold the first terminal 21 low after signaling a contact force or when a high voltage waveform is applied to the piezo actuator 2 by the driver circuit 12 to generate a haptic sensation. The delay feedback system 27 may include a delay 28 and a switch 30.

The purpose of the delay 28 is to ensure that there is enough of a time lapse, so that the wake-up signal at the output 26 has a duration that is long enough to be captured by the MCU 4 or other logic circuit before the protection circuit 27 starts and removes the wake-up signals, i.e. pulls the first terminal 21 to ground via the switch 30. The value of the delay 28 may be adjusted based on the characteristics of the wake-up circuit 11, e.g. the capacitance of the capacitor c1 and breakdown voltages of m1 and diodes d1 and d2 The value of the delay 28 may be in the range of 1 μs to 100 ms; however, some systems may require shorter, e.g. 1 ηs to 1 μs or longer, e.g. >100 ms, delay due to conditions specific to the application, e.g. type of piezo actuator 2 and MCU 4 or custom logic used in the implementation.

The first terminal 21 of the transistor m1 may be biased to a reference voltage v1, while keeping the transistor m1 'off' when pressure is not applied to the piezo actuator 2. The first terminal 21 may be maintained at a low reference voltage V1 (0-0.5 V), i.e. below the threshold voltage Vt of the transistor m1 (0.6-0.7 V), while keeping the transistor m1 'off' when force is not applied to the piezo actuator 2.

Initially, when there is no pressure on the piezo actuator 2, an optional enable signal from the MCU 4 to the switch 30 is low, i.e. the switch 30 is closed or ON, and the first terminal 21 of the transistor m1 is pulled down to ground. The transistor m1 is 'off', setting the output at the input/output 26 to a high level, e.g. Vc.

The sensing circuit 11 may also be activated by the MCU 4 setting the enable signal to high opening the switch 30, whereby the first terminal 21 is disconnected from ground. When the user applies pressure to the piezo element 2, a voltage signal, typically 1 to 5 V for 200 to 400 ms, is generated by the piezo element 2. The voltage from the piezo element 2 is coupled through the capacitor c1 to the first terminal 21 of the transistor m1. The high impedance of the node of the first terminal 21 maximizes the coupled voltage signal to the transistor m1. When the coupled voltage signal crosses a predefined threshold voltage Vt, e.g. approximately 0.7 V, the transistor m1 turns 'ON', pulling the output at the output 26 to a low level, while the transistor m1 conducts via the load resistor r1. The low level output voltage at output 26 is detected as a wakeup signal by the driver circuit 12 itself directly from the output 26 or via the MCU 4. Then the MCU 4 accurately senses the voltage generated by the piezo element 2 via ADC 13, and determines whether the pressure event on the piezo element 2 is a legitimate event to trigger a haptic signal response. Once the output at output 26 is low and after a predefined delay, e.g. <10 ms, by the delay 28 the first terminal 21 of the transistor m1 is pulled back down to ground by the feedback loop 27 and/or the enable signal from the MCU 4 by closing the switch 30, and the output voltage at the output 26 is set back to a high level as the transistor m1 is turned off and no longer conducting. During or after the delay, the output 26 of the wakeup circuit 11 and/or the MCU 4 sends a haptic feedback ready signal to the driver circuit 12 on the piezo IC 3, which generates the high voltage haptic signal back on the piezo actuator 2, thereby providing the haptic sensation to the user. Pulling down to ground the first terminal 21 of the transistor m1, thereby disabling the capacitive coupling between capacitor c1 and the transistor m1, protects the low voltage wakeup circuitry 11 from the high voltage haptic signal applied to the piezo element 2. Accordingly, only the capacitor c1 needs to support high voltage.

A set of anti-parallel diodes d1 and d2 may be provided between the capacitor c1 and the switch 30. The anti-parallel diodes d1 and d2 may be connected to ground or connected to an arbitrary reference voltage V1, below the threshold voltage Vt of the first terminal 21, which would help bias the first terminal 21 at a higher voltage, as hereinbefore discussed. Accordingly, the wake-up circuit 11, i.e. the transistor m1, could detect a smaller voltage (Vt-V1) coming from the piezo element 2. The first diode d1 also protects the first terminal 21, if the charges from capacitor c1 push the node below ground or the reference, i.e. clip the high (<-1V) negative voltages.

The second diode d2 compensates for any leakage current from the capacitor c1 that would slowly charge the first terminal 21 and create a false detection. As the voltage increase slowly due to leakage, the current conducted through the second diode d2 will increase as a function of the threshold voltage of the second diode d2 and the resistance of component rd2 limiting the voltage at the first terminal 21. The component rd2 may be connected in series with the second diode d2 to increase the voltage limit and detect smaller coupled signals. The component rd2 may comprise any suitable component, e.g. a resistor, a diode, and a transistor connected in a diode. Typically, the second diode d2 would limit the voltage at node 21 to approximately its forward voltage (Vf), e.g. around 0.7 V. However, if the first and second diodes d1 and d2 are connected to GND, and the resistor rd2 is connected in series with the second diode d2 the voltage limit on the first terminal 21 may be increased to Vf+Vrd2 in order for the transistor m1 to detect the piezo signal. However, with the resistor rd2 connected in series with the second diode d2, the second diode d2 may not be able to serve as protection for the transistor m1 when high voltage is applied to the piezo element 2.

Selection of the anti-parallel diodes d1 and d2 may also be used to bias the first terminal 21 at a different voltage. For example, a conventional silicon diode typically has a forward voltage of 0.6-0.7 volts, whereas a Schottky diode typically has a forward voltage of 0.15-0.45 volts. The anti-parallel diodes keep the node of the first terminal 21 at a very high impedance, e.g. greater than 1 GΩ, preferably greater than 5 GΩ, and more preferably greater than 10 GΩ, and enable the low voltage (1V) and low frequency (10 Hz) signal generated when pressure is applied to the piezo actuator 2 to be coupled and detected by the wake-up circuit 11. For example: when the capacitor c1 comprises a 10 pF capacitor and the piezo signal is in the range of 1 to 10 Hz, the impedance may be from 1.6 GΩ to 16 GΩ.

Figure 3:
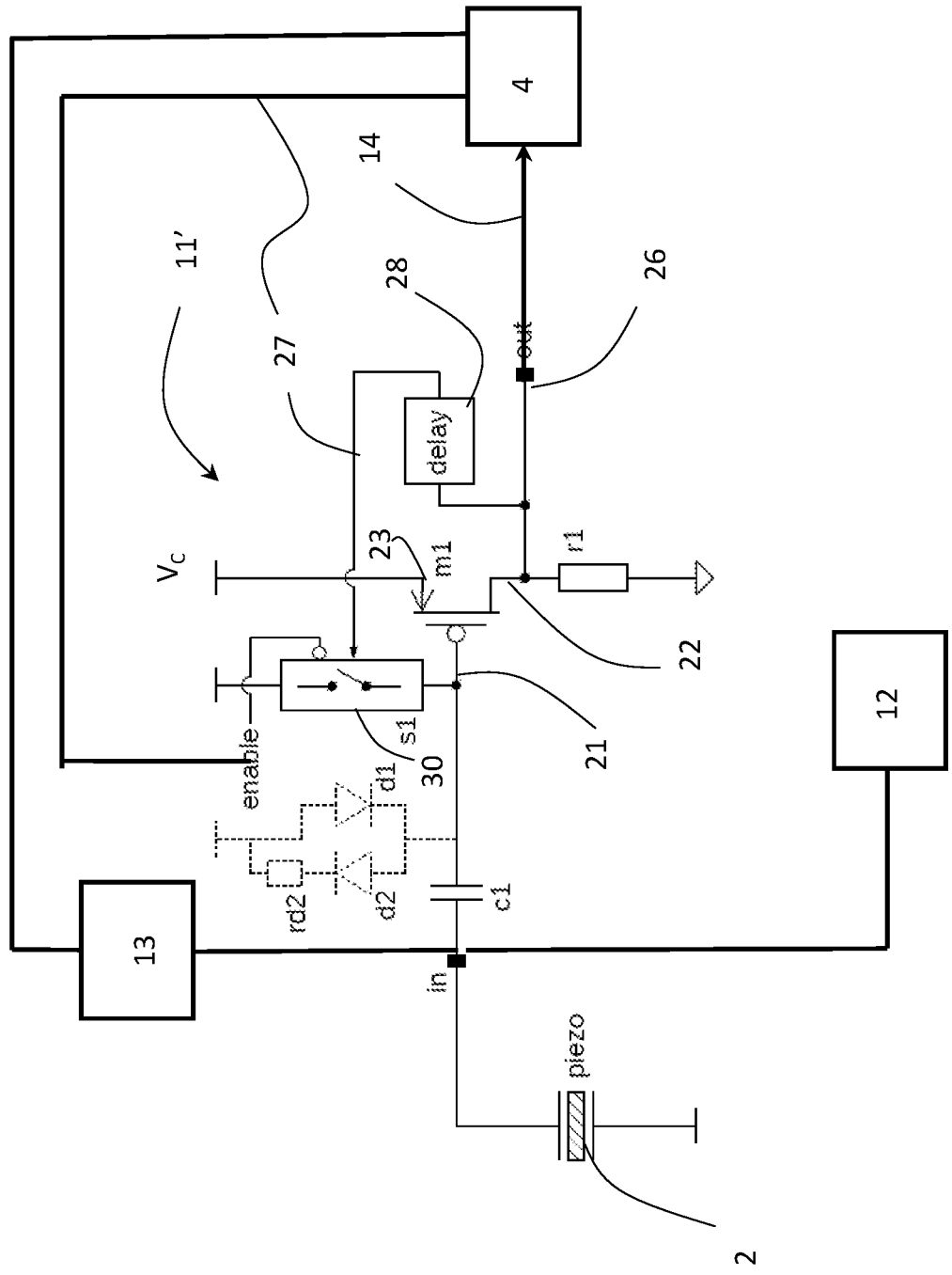
FIG. 3 is a schematic diagram of an alternate embodiment of a wake-up circuit of the device of FIG. 1.

FIG. 3 illustrates an alternative embodiment of a wakeup circuit 11', in which a PMOS transistor m1 is substituted for the NMOS transistor m1 of FIG. 2, whereby the third terminal, e.g. source, is connected to the voltage source Vc, and the second terminal, e.g. drain, is connected to ground. The negative threshold voltage of the PMOS m1 enables detection of negative voltage change on the piezo/current sink from the piezo element, whereby the piezoelectric circuit may be used in systems, in which the piezo actuator 2 is held for a long period, and then released or in systems where the event to be detected creates a signal of negative polarity For example: if the piezo actuator 2 is inserted somewhere in which there should be a mechanical preload. If the preload is removed, e.g. the user removes their hand of the device or mechanical device failed, the system may be notified to take the appropriate action.

Figure 4:
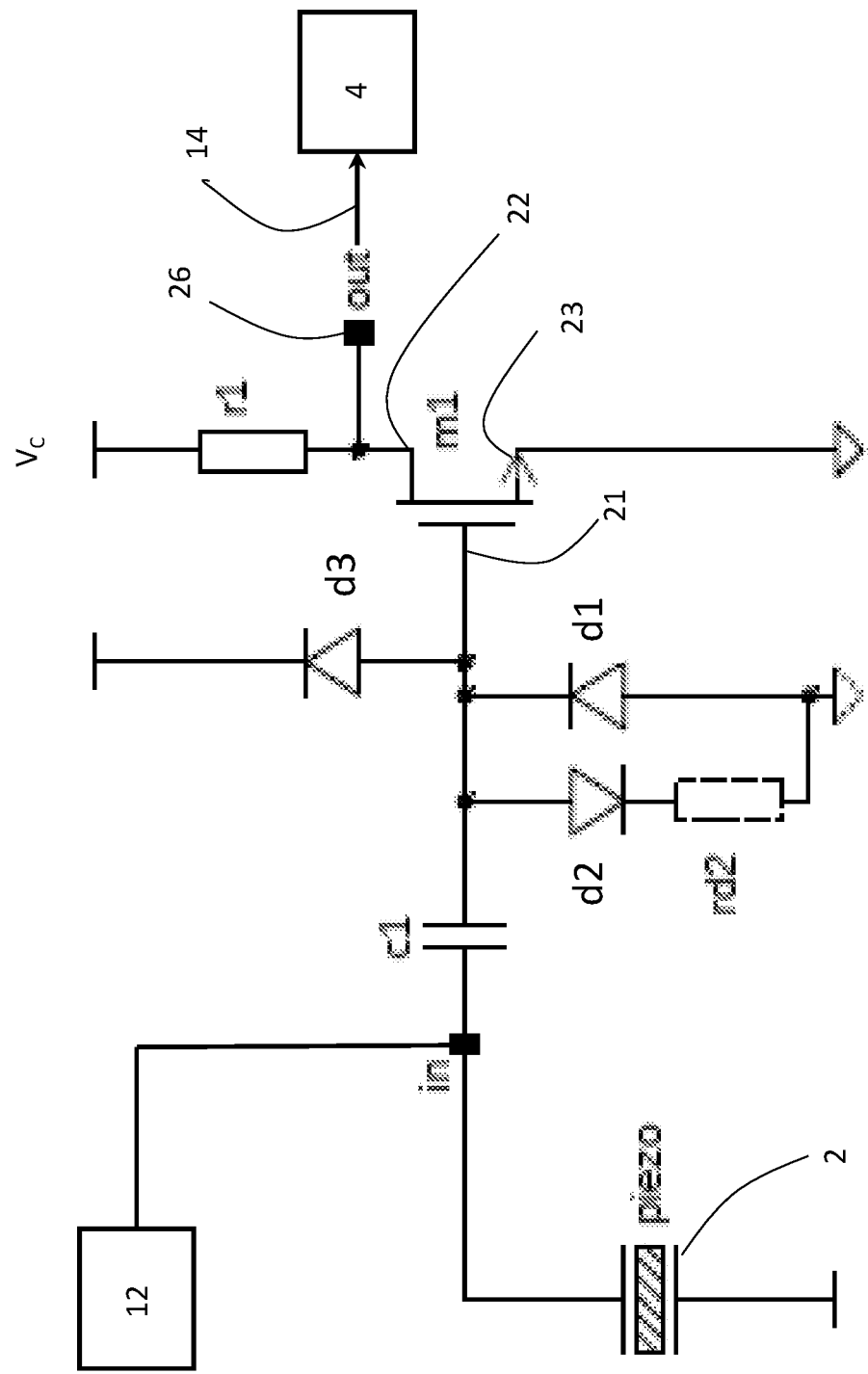
FIG. 4 is a schematic diagram of an alternate embodiment of a wake-up circuit for a haptic feedback circuit.

FIG. 4 illustrates an alternative embodiment of a wakeup circuit 11" in which the wakeup circuit 11" may comprise a common source circuit including the suitable transistor m1, e.g. an NMOS transistor, including the first, second, and third terminals 21, 22, and 23, e.g. gate, drain and source. The piezo actuator 2 may be AC coupled to the first terminal 21 via a high voltage capacitor c1. A voltage source Vc, e.g. the power supply for the piezo IC 3 of 1V-5V, is connected to the second terminal 22 via a load resistor r1. An output 26 is also connected to the second terminal 22 for connection with the MCU 4 via the interrupt 14.

In place of the feedback loop 27, the protective circuit comprises a clamping diode d3, extending between the first terminal 21 and the reference voltage Vc. The clamping diode d3 protects the first terminal 21 from receiving too high a voltage, which could possibly damage the transistor m1, e.g. the haptic voltage signal or too high a sensing voltage. If the first terminal 21 goes above the reference voltage Vc, the feedback diode d3 will clamp its value at the first terminal 21 at a value close to Vc, e.g. Vc+Vf (forward voltage of diode d3).

Antiparallel first and second diodes d1 and d2 may be provided in between the capacitor c1 and the first terminal 21. The anti-parallel diodes d1 and d2 may be connected to ground or it may be connected to an arbitrary reference voltage V1, which help bias the first terminal 21 at a voltage higher than ground but lower than the threshold voltage Vt of the transistor m1, e.g. Vt-V1. Then the wake-up circuit 11, i.e. the transistor m1, could detect a smaller voltage, i.e. smaller than typical threshold voltage of transistor m1, coming from the piezo element 2. The first diode d1 also protects the first terminal 21 if the charges from capacitor C1 push the first terminal 21 below ground or the reference voltage, i.e. clip the high (<−1V) negative voltages.

The second diode d2 compensates any leakage current from the clamping diode d3 or the capacitor c1 that would slowly charge the first terminal 21 and create a false detection. As the voltage increases slowly due to leakage, the current conducted through the second diode d2 will increase as a function of the threshold voltage of the second diode d2 and the resistance value of the component rd2 in series with the second diode d2 limiting the voltage at the fist terminal 21.

The component rd2 may be connected in series with the second diode d2 to increase the voltage limit and detect smaller coupled signals. Typically, the second diode d2 will limit the voltage at node 21 to approximately its forward voltage (Vf), e.g. around 0.7 V. However, if the first and second diodes d1 and d2 are connected to GND, and a resistor rd2 in placed in series with the second diode D2 the voltage limit on the first terminal 21 may be increased to Vf+Vrd2 in order for the transistor m1 to detect the piezo signal. However, with the component rd2 connected in series with the second diode d2, the second diode d2 may not serve as protection for the transistor m1 when high voltage is applied to the piezo element 2.

Figure 5:
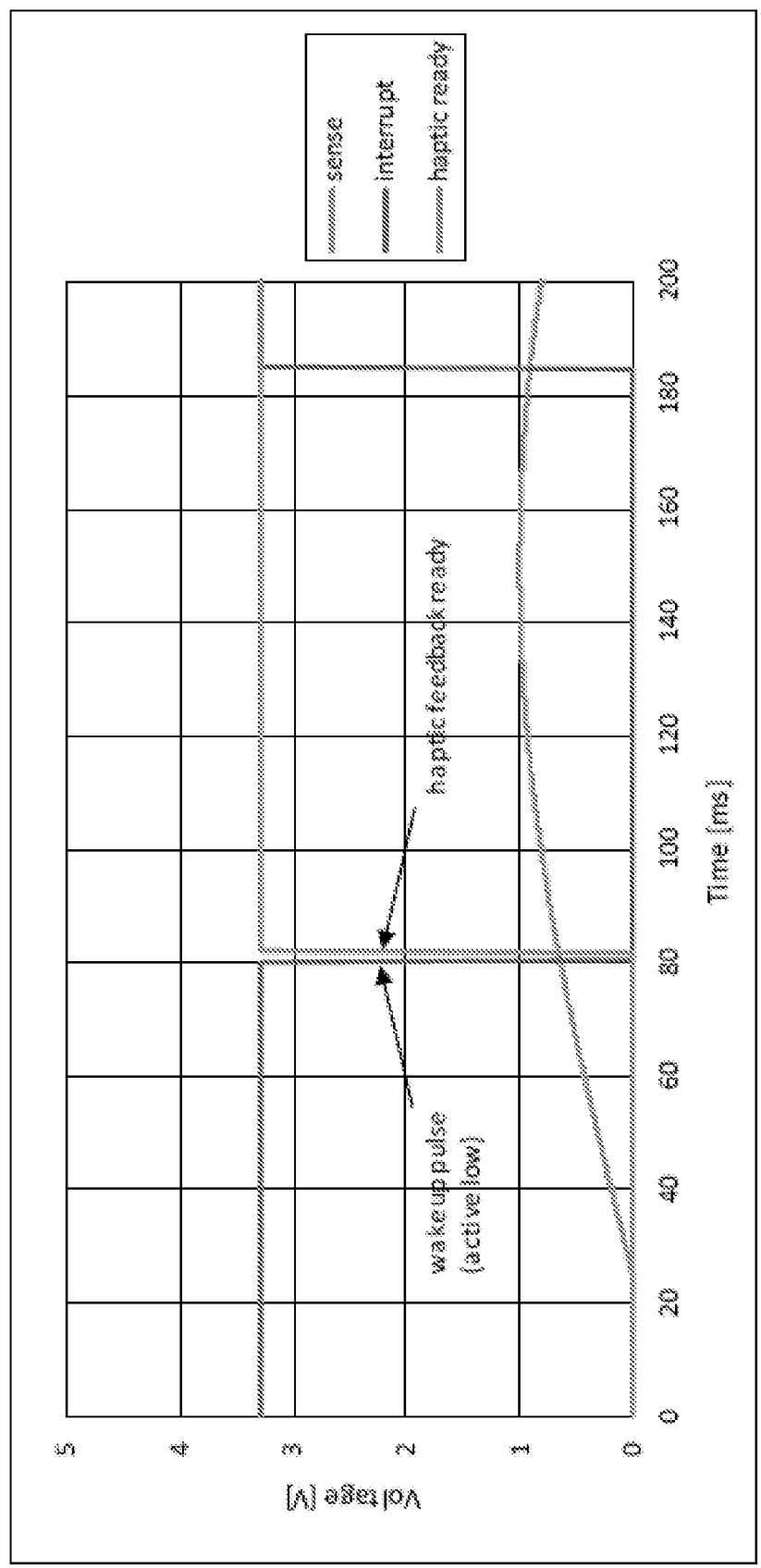
FIG. 5 is a plot of time vs voltage illustrating a touch sensing signal, a wake-up pulse and a haptic feedback ready pulse of an embodiment of the present invention.

With reference to FIG. 5, the latency between a trigger event, e.g. force application, and the haptic feedback is illustrated, in which a voltage signal, e.g. typical 1 V to 5 V for 200 ms to 400 ms, is generated by the piezo actuator 2 when a user applies a force to the piezoelectric actuator 2. A wake-up pulse is generated by the piezo IC 3 when the sense signal crosses a predefined threshold voltage, e.g. about 0.7 V, and the driver circuit 12 is powered up. The driver circuit 12, then sends a haptic feedback ready signal to the MCU 4 indicating that the driver circuit 12 is ready to generate the high voltage haptic signal. Accordingly, the piezo-electric circuit 1 is ready to generate a haptic waveform in less than 1 ms and protect the wake-up circuit 11 from the high voltage haptic signal.

Figure 6:
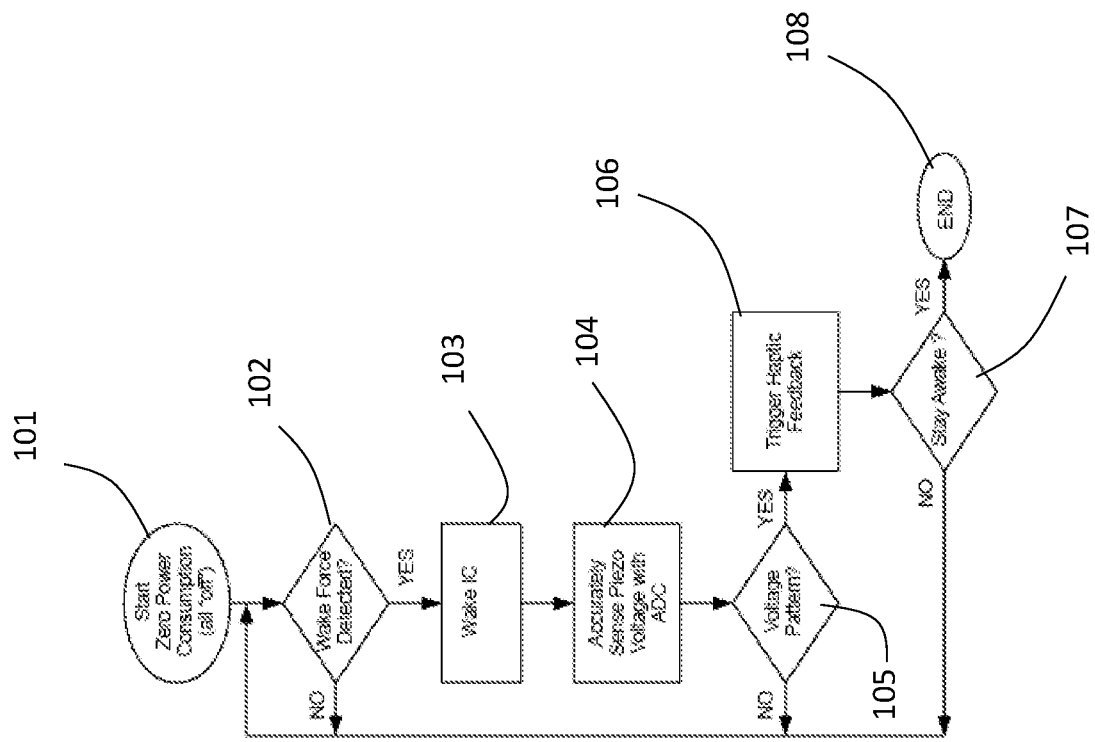
FIG. 6 is a flow chart of a method in accordance with the present invention.

FIG. 6 illustrates a decision algorithm for the piezoelectric circuit 1: At the Start 100 there is no power consumption and everything, i.e. transistor m1, is turned off, the piezo IC 3 and the MCU 4 are in power down mode. When piezo actuator 2 senses force by a user at 102, and generates a trigger signal inside the piezo driver IC 3 to the MCU 4, the piezo driver IC 3 wakes up at 103 utilizing low power consumption. Next, at 104, the MCU 4 accurately senses the voltage generated by the piezo actuator 2 converted by the ADC 13. Based on the voltage pattern 105 generated by the piezo actuator 2, e.g. whether a voltage or a change in voltage, i.e. derivative, is above a predetermined threshold, the MCU 4 decide to either: i) Trigger haptic feedback at 106 and stay awake at step 107 and proceed to 108; ii) Trigger haptic feedback at 106 and go to sleep at step 107 by proceeding back to 101; or iii) False positive detection, no haptic feedback, and proceed back to 101 until next event is detected. During steps 105 and 106, the switch 30 or other protective circuit may be used to protect the transistor m1 from the haptic feedback signal.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A piezoelectric circuit comprising:
   a piezoelectric actuator for generating a sensing signal in response to a force application, and for generating a haptic response in response to a haptic voltage signal;
   a driver circuit for generating the haptic voltage signal in response to a wake-up signal;
   a wakeup circuit configured to not draw power when force is not applied to the piezoelectric actuator comprising:
      a capacitor coupled to the piezoelectric actuator;
      a transistor including a first terminal capacitively coupled via the capacitor to the piezoelectric actuator for receiving the sensing signal, a second terminal connected to a voltage source, and a third terminal connected to ground, wherein the transistor is configured to conduct when the sensing signal is valid; and
      an output connected to the second terminal for providing the wake-up signal to the driver circuit when the transistor conducts; and
   a feedback system including a switch providing a path to ground in between the capacitor and the first terminal, wherein the switch is configured to be closed when the transistor conducts, protecting the transistor from the haptic voltage signal or any voltage signal high enough to damage the transistor.

2. The piezoelectric circuit according to claim 1, further comprising:
   a controller connected to the output, and configured for: determining when the sensing signal is valid, closing the switch to provide a path to ground between the capacitor and the first terminal thereby disabling the capacitive coupling between the piezoelectric actuator and the first terminal when the sensing signal is valid, and activating the driver circuit to transmit the haptic voltage signal to the piezoelectric actuator providing a haptic response to the force application.

3. The piezoelectric circuit according to claim 1, wherein the feedback system comprises a feedback loop connected between the second terminal and the first terminal.

4. The piezoelectric circuit according to claim 3, wherein the feedback loop also includes a delay providing a predetermined time lapse before the switch is closed for disabling the capacitive coupling between the piezoelectric actuator and the first terminal.

5. The piezoelectric circuit according to claim 1, further comprising first and second anti-parallel diodes between the capacitor and the first terminal for maintaining the first terminal at a predetermined reference voltage, while providing high input impedance, for protecting the first terminal from voltages above a desired upper level and below a desired lower level.

6. The piezoelectric circuit according to claim 5, further comprising a resistor in series with the second diode to increase the desired upper level above a threshold voltage of the transistor.

7. The piezoelectric circuit according to claim 5, wherein the first and second diodes are biased to a reference voltage, thereby biasing the first terminal above ground but below a threshold voltage of the transistor.

8. The piezoelectric circuit according to claim 1, wherein the sensing signal is valid when the sensing signal comprises a voltage above a predetermined threshold voltage of the transistor.

9. The piezoelectric circuit according to claim 1, wherein the sensing signal is valid when the sensing signal includes a change in voltage above a predetermined change in voltage.

10. The piezoelectric circuit according to claim 1, wherein the transistor comprises a negative threshold voltage, wherein removal of the force application from the piezoelectric actuator generates the sensing signal.

11. The piezoelectric circuit according to claim 1, wherein the capacitor includes a breakdown voltage equal to or greater than a maximum haptic voltage signal.

12. A piezoelectric circuit comprising:
a piezoelectric actuator for generating a sensing signal in response to a force application, and for generating a haptic response in response to a haptic voltage signal;
an driver circuit for generating the haptic voltage signal;
a wakeup circuit comprising:
a capacitor coupled to the piezoelectric actuator;
a transistor including a first terminal capacitively coupled via the capacitor to the piezoelectric actuator for receiving the sensing signal, a second terminal connected to a voltage source, and a third terminal connected to ground, wherein the transistor is configured to conduct when the sensing signal is above a first threshold voltage; and
an output connected to the second terminal;
a feedback loop including a switch providing a path to ground in between the capacitor and the first terminal; and
a controller connected to the output, and configured for:
determining when the sensing signal is valid, providing a wake-up signal to the driver circuit when the transistor conducts, closing the switch to provide a path to ground between the capacitor and the first terminal thereby disabling the capacitive coupling between the piezoelectric actuator and the first terminal, and activating the driver circuit to transmit the haptic voltage signal to the piezoelectric actuator providing a haptic response to the force application.

13. The piezoelectric circuit according to claim 12, wherein the feedback loop also includes a delay providing a predetermined time lapse before the switch is closed for disabling the capacitive coupling between the piezoelectric actuator and the first terminal.

14. The piezoelectric circuit according to claim 12, further comprising first and second anti-parallel diodes between the capacitor and the first terminal for maintaining the first terminal at a predetermined reference voltage, while providing high impedance, for protecting the first terminal from voltages above a desired upper level and below a desired lower level.

15. The piezoelectric circuit according to claim 14, further comprising a resistor in series with the second diode to increase the desired upper level above a threshold voltage of the transistor.

16. The piezoelectric circuit according to claim 14, wherein the first and second diodes are biased to a reference voltage, thereby biasing the first terminal above ground but below a threshold voltage of the transistor.

17. The piezoelectric circuit according to claim 12, wherein the sensing signal is valid when the sensing signal comprises a voltage above a predetermined threshold voltage of the transistor.

18. A piezoelectric circuit comprising:
a piezoelectric actuator for generating a sensing signal in response to a force application, and for generating a haptic response in response to a haptic voltage signal;
an driver circuit for generating the haptic voltage signal;
a wakeup circuit comprising:
a capacitor coupled to the piezoelectric actuator;
a transistor including a first terminal capacitively coupled via the capacitor to the piezoelectric actuator for receiving the sensing signal, a second terminal connected to a voltage source, and a third terminal connected to ground, wherein the transistor is configured to conduct when the sensing signal is above a first threshold voltage;
an output connected to the second terminal for providing a wake-up signal to the driver circuit when the transistor conducts; and
a clamping diode connected between the first terminal and a reference voltage configured for preventing a voltage at the first terminal from exceeding a predetermined amount.

19. The piezoelectric circuit according to claim 18, further comprising first and second anti-parallel diodes between the capacitor and the first terminal for maintaining the first terminal at a predetermined reference voltage, while providing high impedance, for protecting the first terminal from voltages above a desired upper level and below a desired lower level.

20. The piezoelectric circuit according to claim 19, further comprising a resistor in series with the second diode to increase the desired upper level above a threshold voltage of the transistor.

* * * * *